(12) United States Patent
Chen et al.

(10) Patent No.: US 8,735,727 B2
(45) Date of Patent: May 27, 2014

(54) ELECTRONIC DEVICE HAVING CABLE HOLDING DEVICE

(75) Inventors: Yun-Lung Chen, New Taipei (TW); Chung Chai, New Taipei (TW); Zhao-Bin Yang, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 177 days.

(21) Appl. No.: 13/326,425

(22) Filed: Dec. 15, 2011

(65) Prior Publication Data

US 2012/0307462 A1 Dec. 6, 2012

(30) Foreign Application Priority Data

Jun. 2, 2011 (CN) .......................... 2011 1 0147627

(51) Int. Cl.
*H01B 7/00* (2006.01)
*H05K 5/00* (2006.01)
*H05K 7/00* (2006.01)
*G06F 1/16* (2006.01)

(52) U.S. Cl.
USPC .............. 174/135; 361/679.01; 361/679.02; 361/752

(58) Field of Classification Search
USPC .................. 361/752, 748, 679.01, 600, 807, 361/679.02, 679.32–33; 174/19, 68.1, 68.2, 174/68.3, 91, 93, 267, 562, 60, 100, 500, 174/64, 72, 97, 135; 439/501, 445, 495, 439/502, 450, 650; 248/68.1, 74.3
See application file for complete search history.

(56) References Cited

U.S. PATENT DOCUMENTS

| | | | | |
|---|---|---|---|---|
| 3,960,425 A * | 6/1976 | Kirk et al. | ........................ | 439/55 |
| 4,669,688 A * | 6/1987 | Itoh et al. | ..................... | 248/74.2 |
| 4,955,814 A * | 9/1990 | Christie et al. | ................... | 439/77 |
| 5,523,917 A * | 6/1996 | Searby | ....................... | 361/679.48 |
| 5,723,823 A * | 3/1998 | Bell | ............................... | 174/262 |
| 5,980,307 A * | 11/1999 | Brewster et al. | .............. | 439/493 |
| 6,498,293 B2 * | 12/2002 | Marchand et al. | ............. | 174/50 |
| 6,737,577 B1 * | 5/2004 | Liao et al. | ....................... | 174/50 |
| 6,749,157 B2 * | 6/2004 | Takeuchi | ........................ | 248/71 |
| 7,128,598 B2 * | 10/2006 | Ebert et al. | .................... | 439/495 |
| 8,513,521 B2 * | 8/2013 | Zhang et al. | ................... | 174/60 |
| 2010/0259884 A1 * | 10/2010 | Wang et al. | .............. | 361/679.33 |
| 2011/0141688 A1 * | 6/2011 | Li et al. | .................... | 361/679.51 |
| 2012/0154992 A1 * | 6/2012 | Zhou | ........................ | 361/679.01 |

* cited by examiner

*Primary Examiner* — Jenny L Wagner
*Assistant Examiner* — Ahmad D Barnes
(74) *Attorney, Agent, or Firm* — Novak Druce Connolly Bove + Quigg LLP

(57) ABSTRACT

An electronic device having a cable holding device is disclosed. The electronic device comprises a case; a circuit board in the case; a cable holding device attached to the circuit board and defining a through hole, a first positioning slot and a second positioning slot; the first positioning slot communicating with the through hole, and the second positioning slot communicating with the through hole; a cable electronically connected to the circuit board; wherein the cable is received either in the first positioning slot and the through hole or in the second positioning slot and the through hole.

15 Claims, 5 Drawing Sheets

ELECTRONIC DEVICE HAVING CABLE HOLDING DEVICE

BACKGROUND

1. Technical Field

The present disclosure relates to electronic devices, more particularly to an electronic device having a cable holding device.

2. Description of Related Art

The front plate of a computer often presents an array of sockets for connecting to a plurality of peripheral components, such as an earphone, a keyboard, and a mouse. Many signal cables are connected to a motherboard or a circuit board, behind the array of sockets in the interior of the enclosure. However, loose or irregularly placed cables may interfere with electronic components or be damaged by the components in the computer system over a period of time. Therefore, an improved cable holding device for an electronic device may be desired.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
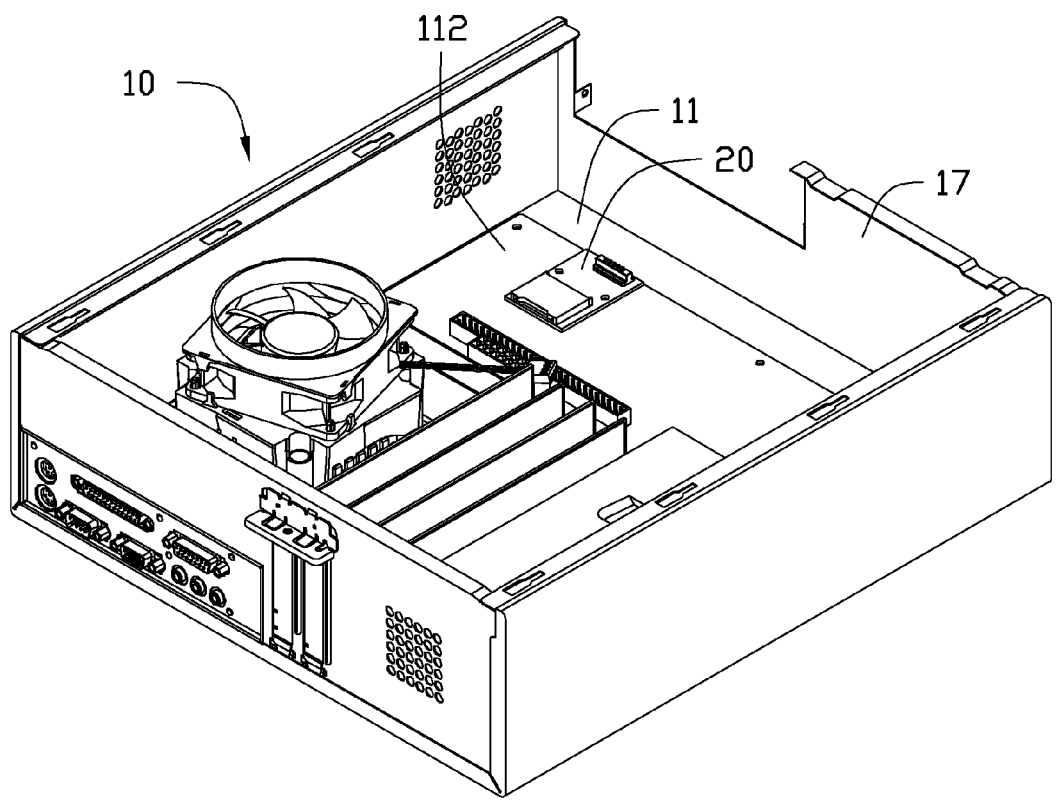
FIG. 1 is an exploded, isometric view of one embodiment of an electronic device, the electronic device including a case, and a cable holding device.
Figure 2:
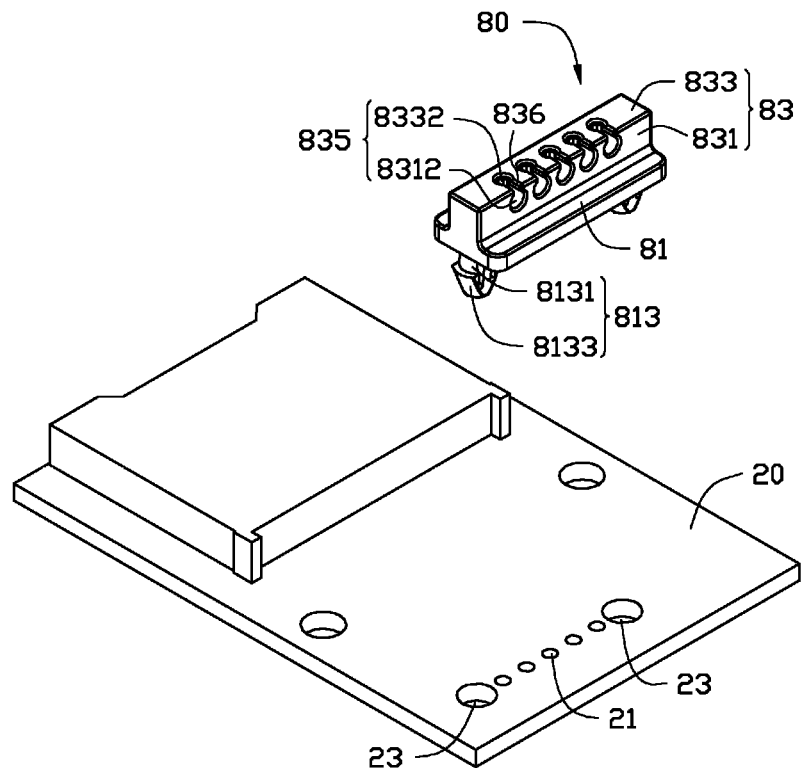
FIG. 2 is an exploded, isometric view of a circuit board and a cable holding device of the electronic device.

Referring to FIGS. 1 and 2, one embodiment of an electronic device comprises a case 10 and a cable holding device 80. In one embodiment, the cable holding device 80 may provide support for all input and output connections of the electronic device.

The case 10 comprises a bottom plate 11 and a front plate 17 connected to the bottom plate 11. In one embodiment, the front plate 17 is substantially perpendicular to the bottom plate 11.

A motherboard 112 is attached to the bottom plate 11. A circuit board 20 is electronically connected to the motherboard 112 and adjacent to the front plate 17.

Referring to FIG. 2, the circuit board 20 defines a plurality of securing holes 21 and two clipping holes 23 arranged on opposite sides of the plurality of securing holes 21. In one embodiment, center points of the plurality of securing holes 21 and the two clipping holes 23 cooperatively defines an imaginary straight line.

The cable holding device 80 comprises a base 81 and a cable holding portion 83 connected to the base 81. The base 81 defines a plurality of through holes 811 (shown in FIG. 5) corresponding to the plurality of securing holes 21. Two clipping portions, such as two hooks 813, extend from a bottom surface of the base 81. The two hooks 813 can be deformable to engage in the two clipping holes 23. Each hook 813 comprises an extending portion 8131 and two engaging portions 8133. The extending portion 8131 extends perpendicularly downwards from the bottom surface of the base 81, and each engaging portion 8133 extends upwards in a slanting manner from the extending portion 8131. In one embodiment, the cable holding device 80 is made of plastic.

The cable holding portion 83 comprises a side panel 831 and a top panel 833 connected to the side panel 831. In one embodiment, the side panel 831 is substantially perpendicular to the top panel 833. A plurality of positioning portion 835 is defined in the cable holding portion 83. Each of the plurality of positioning portions 835 comprises a first positioning slot 8312 and a second positioning slot 8332 communicating with the first positioning slot 8312. The first positioning slot 8312 is defined in the side panel 831, and an extending direction of the first positioning slot 8312 is substantially parallel to base 81. The second positioning slot 8332 communicates with each of the plurality of through holes 811, and an extending direction of the second positioning slot 8332 is substantially perpendicular to the base 81. In one embodiment, the first positioning slot 8312 communicates with each of the plurality of through holes 811 via the second positioning slot 8332. A diameter of the first positioning slot 8312 is substantially equal to that of the second positioning slot 8332, but greater than that of each of the plurality of through holes 811. In one embodiment, a protrusion 836 is located between each first positioning slot 8312 and each second positioning slot 8332. The protrusion 836 acts as a separator and a physical impediment between each first positioning slot 8312 and each second positioning slot 8332.

Figure 3:
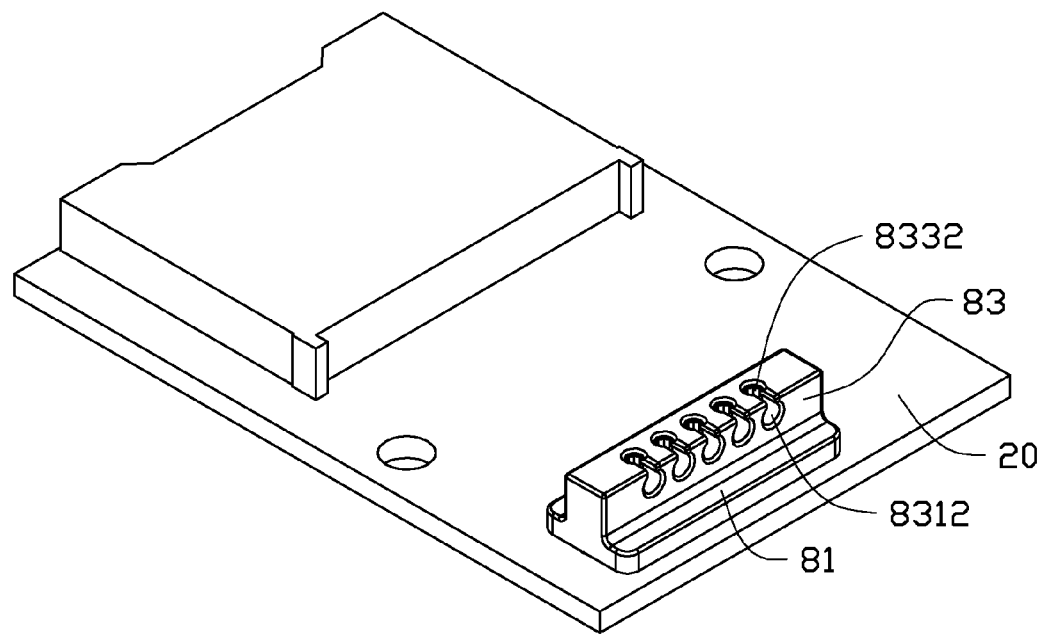
FIG. 3 is an assembled view of FIG. 2.

Referring to FIG. 3, the cable holding device 80 is placed on the circuit board 20, and the two hooks 813 are aligned with the two clipping holes 23. The cable holding device 80 is pressed towards the circuit board 20, and the two hooks 813 are deformed to engage in the two clipping holes 23. At this time, the engaging portion 8133 is resisted on a bottom surface of the circuit board 20. Thus, the cable holding device 80 is secured to the circuit board 20. At this position, the plurality of securing holes 21 are aligned with the plurality of through holes 811.

Figure 4:
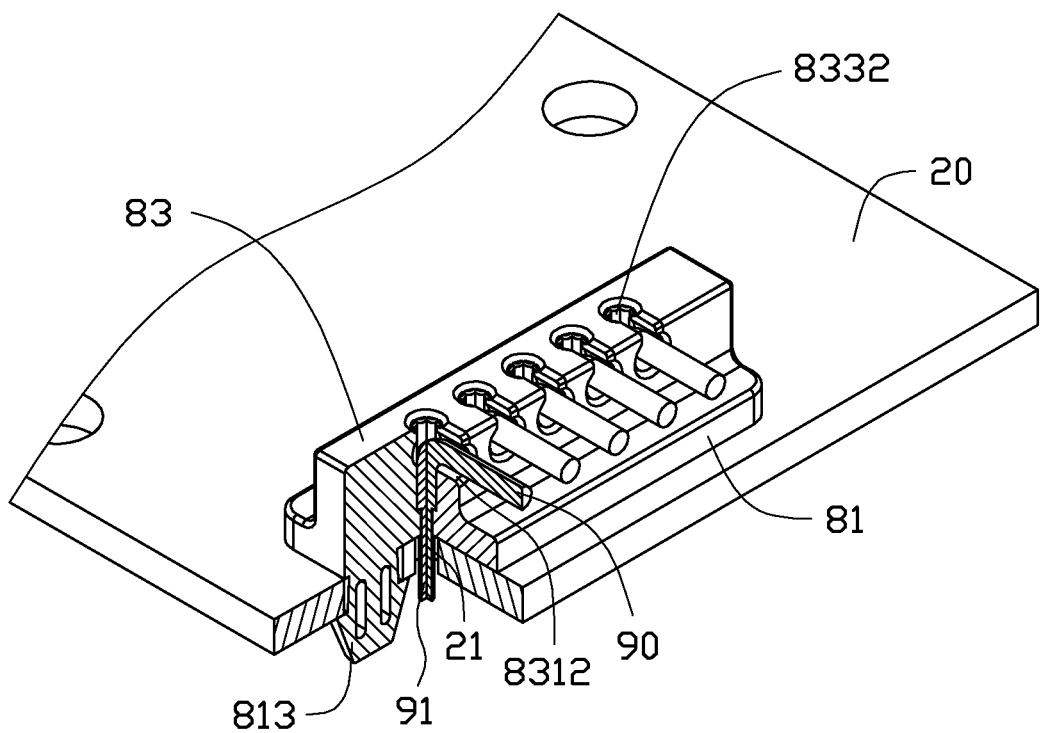
FIG. 4 is an assembled view of a cable, the circuit board and a cable holding device of the electronic device, and the cable is located in a first position.
Figure 5:
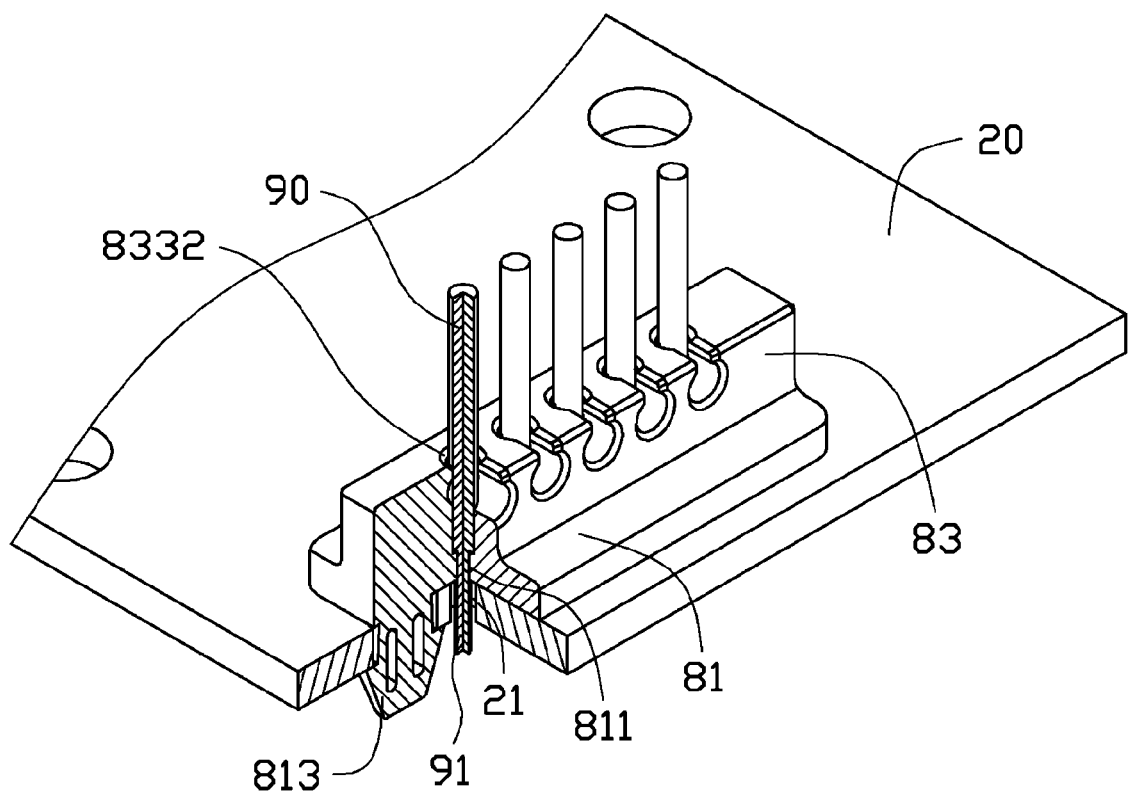
FIG. 5 is similar to FIG. 4, but shows the cable in a second position.

Referring to FIGS. 4-5, the cable holding device 80 can manage a plurality of cables 90 to electronically connect to the circuit board 20. Each of the plurality of cables 90 comprises a cable core 91. Each of the plurality of cables 90 is flexible after the point of connection to the cable holding device 80 may be located in a first position or a second position. In the first position, each of the plurality of cables 90 extends out of the first positioning slots 8312, and bents for extending through the second positioning slots 8332; and the cable core 91 is engaged in a corresponding one of the plurality of through holes 811 and a corresponding one of the plurality of securing holes 21. In the second position, each of the plurality of cables 90 extends out of the second positioning slots 8332; and the cable core 91 is engaged in a corresponding one of the plurality of through holes 811 and the corresponding one of the plurality of securing holes 21. In one embodiment, the cable core 91 is electronically connected to the circuit board 20 by jointing.

In one embodiment, each first positioning slot 8312 is separated from each second positioning slot 8332. However, the first positioning slot 8312 communicates with one of the plurality of through holes 811, and the second positioning slot 8332 communicates with one of the plurality of through holes 811. When each of the plurality of cables 90 is located in the first position, the plurality of cables 90 can directly extend from the first positioning slot 8312 to one of the plurality of through holes 811 and one of the plurality of the securing holes 21. Therefore, when one of the plurality of cables 90 needs to be located in the first position, the plurality of cables 90 can be engaged in the first positioning slot 8312 and one of the plurality of through holes 811. When one of the plurality of cables 90 needs to be located in the second position, the plurality of cables 90 can be engaged in the second positioning slot 8332.

Although numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
 a case comprising a bottom plate and a front plate connected to the bottom plate; a mother board attached to the bottom plate;
 a circuit board electronically connected to the mother board and adjacent to the front plate; the circuit board defining a clipping hole;
 a cable holding device attached to the circuit board and defining a through hole, a first positioning slot and a second positioning slot; the first positioning slot communicating with the through hole, and the second positioning slot communicating with the through hole; the cable holding device comprising a clipping portion, the clipping portion comprising an extending portion and two engaging portions; the extending portion extending perpendicularly downwards from the bottom surface of the base and each engaging portion slanting upwards from the extending portion;
 a cable electronically connected to the circuit board;
 wherein the clipping portion is deformable to engage in the clipping hole, and the engaging portion is resisted on a bottom surface of the circuit board, to prevent the clipping portion from disengaging from the circuit board; and the cable is received either in the first positioning slot and the through hole or in the second positioning slot and the through hole.

2. The electronic device of claim 1, wherein an extending direction of the first positioning slot is substantially perpendicular to an extending direction of the second positioning slot.

3. The electronic device of claim 1, wherein the first positioning slot communicates with the second positioning slot.

4. The electronic device of claim 1, wherein the cable holding device comprises a side panel and a top panel connected to the side panel, the first positioning slot is defined in the side panel, and the second positioning slot is defined in the top panel.

5. The electronic device of claim 4, wherein the cable holding device comprises a protrusion, the protrusion is located between the first positioning slot and the second positioning slot to engage with the cable.

6. The electronic device of claim 1, wherein a diameter of the first positioning slot is substantially equal to a diameter of the second positioning slot, and greater than a diameter of the through hole.

7. The electronic device of claim 1, wherein the cable comprises a cable core, and a securing hole is defined in the circuit board to engage the cable core.

8. The electronic device of claim 1, wherein the cable holding device comprises a base attached to the circuit board, and the through hole is defined in the base.

9. An electronic device comprising:
 a case comprising a bottom plate and a front plate connected to the bottom plate; a mother board attached to the bottom plate;
 a circuit board electronically connected to the mother board and adjacent to the front plate; the circuit board defining a clipping hole;
 a cable holding device attached to the circuit board and defining a through hole, a first positioning slot and a second positioning slot; both the first positioning slot and the second positioning slot communicating with the through hole, and the first positioning slot communicating with the second positioning slot; the cable holding device comprising a clipping portion, the clipping portion comprising an extending portion and two engaging portions; the extending portion extending perpendicularly downwards from the bottom surface of the base and each engaging portion slanting upwards from the extending portion;
 a cable electronically connected to the circuit board;
 wherein the clipping portion is deformable to engage in the clipping hole, and the engaging portion is resisted on a bottom surface of the circuit board, to prevent the clipping portion from disengaging from the circuit board; and the cable is positioned between a first position or a second position; when in the first position, the cable is received in the first positioning slot, the second positioning slot and the through hole, when in the second position, the cable is received in the second positioning slot and the through hole.

10. The electronic device of claim 9, wherein an extending direction of the first positioning slot is substantially perpendicular to an extending direction of the second positioning slot.

11. The electronic device of claim 9, wherein the cable holding device comprises a side panel and a top panel substantially perpendicular to the side panel, the first positioning slot is defined in the side panel, and the second positioning slot is defined in the top panel.

12. The electronic device of claim 11, wherein the cable holding device comprises a protrusion, the protrusion is located between the first positioning slot and the second positioning slot to engage with the cable.

13. The electronic device of claim 9, wherein a diameter of the first positioning slot is substantially equal to a diameter of the second positioning slot, and greater than a diameter of the through hole.

14. The electronic device of claim 9, wherein the cable comprises a cable core, and a securing hole is defined in the circuit board to engage the cable core.

15. The electronic device of claim 9, wherein the cable holding device comprises a base attached to the circuit board, and the through hole is defined in the base.

* * * * *